(12) United States Patent
Kinoshita

(10) Patent No.: US 6,734,605 B2
(45) Date of Patent: May 11, 2004

(54) SURFACE ACOUSTIC WAVE DEVICE AND MANUFACTURING METHOD THEREOF

(75) Inventor: Yusuke Kinoshita, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/066,642

(22) Filed: Feb. 6, 2002

(65) Prior Publication Data

US 2002/0135269 A1 Sep. 26, 2002

(30) Foreign Application Priority Data

Mar. 26, 2001 (JP) .......................................... 2001-088424

(51) Int. Cl.[7] ............................................. H01L 41/053
(52) U.S. Cl. ........................................ 310/348; 310/344
(58) Field of Search ................................ 310/344, 346, 310/348

(56) References Cited

U.S. PATENT DOCUMENTS

| | | | | |
|---|---|---|---|---|
| 3,728,562 A | * | 4/1973 | Herson et al. ............... | 310/326 |
| 4,471,259 A | * | 9/1984 | Stoermer et al. ............ | 310/353 |
| 5,130,600 A | * | 7/1992 | Tomita et al. ............... | 310/329 |
| 6,229,249 B1 | * | 5/2001 | Hatanaka et al. ........... | 310/348 |
| 6,445,254 B1 | * | 9/2002 | Shibuya et al. .............. | 331/68 |
| 6,456,168 B1 | * | 9/2002 | Luff ............................. | 331/68 |
| 6,531,807 B2 | * | 3/2003 | Tanaka et al. ............... | 310/344 |

FOREIGN PATENT DOCUMENTS

| | | | | |
|---|---|---|---|---|
| JP | A-10-70414 | 3/1998 | ............ | H03B/5/32 |
| JP | 2960374 B2 | 7/1999 | ............ | H03B/5/32 |

* cited by examiner

Primary Examiner—Thomas M. Dougherty
(74) Attorney, Agent, or Firm—Oliff & Berridge PLC

(57) ABSTRACT

The invention provides a surface acoustic wave device and a manufacturing method thereof which enhances reliability and yield. A surface acoustic wave device having a surface acoustic wave element and an electronic component that drive controls the surface acoustic wave element is provided with a first substrate, which has a first connecting terminal having a first hollow component formed therewith including an opening that accommodates an electronic component and electrically connecting to the electronic component formed in the first hollow component, and a second connecting terminal formed in the vicinity of the opening and electrically connecting to the first connecting terminal, a second substrate where one face side is joined to the opening of the first substrate and the surface acoustic wave element is electrically connected to the second connecting terminal on the other face side, and a cap which is joined to the first substrate and has a second hollow component that hermetically seals the surface acoustic wave element.

10 Claims, 7 Drawing Sheets

SURFACE ACOUSTIC WAVE DEVICE AND MANUFACTURING METHOD THEREOF

BACKGROUND OF THE INVENTION

1. Field of Invention

The present invention relates to a surface acoustic wave device in which a surface acoustic wave element and an electronic component that drive controls the surface acoustic wave element are packaged.

2. Description of Related Art

Recently, surface acoustic wave devices (hereinafter referred to as "SAW (surface acoustic wave) devices") have been used as resonators or bandpass filters, etc. in electronic components and communication components of mobile telephones and TV receivers, etc.

FIG. 8 is a schematic showing an example of a related art SAW device 1. The SAW device 1 is described with reference to FIG. 8.

The SAW device 1 of FIG. 8 has a substrate 2, a cover 3, an electronic component 5 formed of IC chips, etc. and a SAW element 6, and other elements. A hollow component 2a is formed in the substrate 2. The electronic component 5 and the SAW element 6 are mounted in the hollow component 2a, e.g., with an epoxy adhesive. The cover 3 is arranged on the opening of the hollow component 2a and is joined to the substrate 2 with a sealant or by seam welding. Therefore, the electronic component 5 and the SAW element 6 are in a hermetically sealed state via the substrate 2 and the cover 3.

The SAW element 6 and the electronic component 5, such as semiconductor chips that drive control the SAW element, are arranged side by side in the hollow component 2a. Printed wirings 4 of a predetermined pattern are formed at the bottom of the substrate 2, and the electronic component 5 and the SAW element 6 are electrically connected to the printed wirings 4, e.g., by wire bonding, etc. respectively, thereby electrically connecting the electronic component 5 and the SAW element 6.

FIGS. 9(A)–9(E) are perspective views showing steps of an exemplary related art manufacturing method of a SAW device. The manufacturing method of the SAW device is described with reference to FIG. 9.

First, as shown in FIG. 9(A), printed wirings 4 are formed in a predetermined pattern at the bottom of a hollow component 2a in a substrate 2.

Then, as shown in FIG. 9(B), an electronic component 5 is mounted at the bottom and electrically connected to the printed wirings 4, e.g., by wire bonding, etc.

Subsequently, as shown in FIG. 9(C), a SAW element 6 is mounted at the bottom and electrically connected to the printed wirings 4, e.g., by wire bonding, etc.

Next, as shown in FIG. 9(D), the frequency adjustment of the SAW element 6 is performed. More specifically, a plasma, for example, and the like are irradiated from the opening 2b of the substrate 2 onto the SAW element 6, and a piezoelectric substrate or electrodes formed on a piezoelectric substrate of the SAW element 6 are etched. This frequency adjustment is performed while the SAW element 6 is driven by the electronic component 5. Then, the operation is performed until a desirable frequency characteristic of the SAW element 6 is obtained.

Subsequently, as shown in FIG. 9(E), a cover 3 is arranged on the opening of the substrate 2, and the substrate 2 and the cover 3 are joined with a sealant, thereby hermetically sealing the inside of the hollow component 2a to complete a SAW device 1.

SUMMARY OF THE INVENTION

In the related art SAW device 1 of FIG. 8, the electronic component 5 and the SAW element 6 are arranged side by side. Namely, the electronic component 5 and the SAW element 6 are arranged in the same space, i.e., within the hollow component 2a.

In this instance, if the SAW device 1 is actuated, the electronic component 5 emits heat. The heat emitted from the electronic component 5 is directly transmitted to the SAW element 6 via the atmosphere and the bottom in the hollow component 2a of the substrate 2. The heat greatly affects the temperature characteristics of the SAW element 6 and causes a problem, i.e., that the SAW element 6 cannot display a desirable frequency characteristic.

On the other hand, a so-called two-stage superposed package structure has been proposed as a method for mounting an electronic component 5 and a SAW element 6 in different spaces. When frequency adjustment is performed in a state in which the SAW element 6 is driven by the electronic component 5, however, the process of mounting the electronic component 5 and the SAW element 6 on the packages, respectively, and the process for adhesion and conduction of respective packages must be performed, thereby complicating the manufacturing process.

Accordingly, the present invention addresses the problem referred to above, and provides a SAW device and a manufacturing method thereof which enhances reliability and yield.

The invention in accordance with a first aspect of the invention provides a surface acoustic wave device having a surface acoustic wave element and an electronic component that drive controls the surface acoustic wave element, provided with a first substrate, which has a first connecting terminal having a first hollow component formed therewith, including an opening that accommodates the electronic component and electrically connected to the electronic component formed in the first hollow component, and a second connecting terminal formed in the vicinity of the opening and electrically connected to the first connecting terminal, and a second substrate, which is mounted so that one face side is joined to the opening of the first substrate, and the other face side allows the surface acoustic wave element to be electrically connected to the second connecting terminal, and a cap which is joined to the first substrate and has a second hollow component that hermetically seals the surface acoustic wave element.

In accordance with the structure of the first aspect of the invention, the first hollow component is formed in the first substrate, and the electronic component is mounted in this hollow component. On the other hand, the second substrate has a structure such that one face side is joined to the first substrate, and the surface acoustic wave element is mounted to the other face side. Then, the cap, that seals the surface acoustic wave device in the second hollow component is joined to the first substrate.

Thus, only the electronic component is mounted in the hollow component of the first substrate, and the surface acoustic wave element is mounted on the other face side of the second substrate. Namely, the surface acoustic wave element and the electronic component are arranged in separate spaces partitioned by the first substrate and the second substrate. Therefore, for example, when a plasma is irradiated on the surface acoustic wave element, the electronic component is not exposed to the plasma during the frequency adjustment of the surface acoustic wave device. Moreover, the influence of the heat and electromagnetic wave generated when the electronic component is actuated on the surface acoustic wave element can be suppressed to the minimum.

The invention in accordance with a second aspect of the invention provides a surface acoustic wave device in which the first substrate and the second substrate are joined with a sealant on the lateral face side of the second substrate in the structure of the first aspect of the invention.

In accordance with the structure of the second aspect of the invention, the first substrate and the second substrate are in a state in which they are joined with a sealant applied on the lateral face side of the second substrate, thereby surely hermetically sealing the first hollow component of the first substrate.

The invention in accordance with a third aspect of the invention provides a surface acoustic wave device in which the second substrate and the cap are joined to the first substrate with same sealant, respectively in the structure of either of the first or second aspects.

In accordance with the structure of the third aspect of the invention, with the joint of the first substrate and the second substrate and the joint of the first substrate and the cap, hermetic sealing of the first hollow component and the second hollow component can be simultaneously performed under the same treatment conditions by using the same sealant.

The invention in accordance with a fourth aspect of the invention provides a surface acoustic wave device in which the sealant is made of a conductive brazing metal or a conductive adhesive in the structure of any of the first to third aspects.

In accordance with the structure of the fourth aspect, a shielding effect on electromagnetic wave can be obtained if a conductive brazing metal or a conductive adhesive is used as the sealant.

The invention in accordance with a fifth aspect of the invention provides a surface acoustic wave device in which the sealant is made of a glassy material in the structure of any of the first to third aspects.

In accordance with the structure of the fifth aspect, a cost reduction can be sought by using a glassy material as the sealant.

The invention in accordance with a sixth aspect of the invention provides a surface acoustic wave device in which the grounding electrode is formed on one face side of the second substrate in any of the structures of the first to fifth aspects.

In accordance with the structure of the sixth aspect, the grounding electrode is formed on one face side of the second substrate and is in a state that it is placed between the electronic component and the surface acoustic wave element. Therefore, an electromagnetic wave generated when the electronic component is actuated is shielded by the grounding electrode, thereby reducing its influence on the surface acoustic wave element. Particularly, if a conductive brazing metal or a conductive adhesive is used as the sealant, the shielding effect of the grounding electrode can be further enhanced.

The invention in accordance with a seventh aspect of the invention provides a surface acoustic wave device in which the second substrate includes a ceramic single plate in any of the structures of the first to sixth aspects.

In accordance with the structure of the seventh aspect, back lowering of the entire surface acoustic wave device can be sought by using the ceramic single plate as the second substrate. The thermal expansion coefficients can be made consistent by forming the first substrate and the second substrate from the same material.

The invention in accordance with an eighth aspect of the invention provides a surface acoustic wave device in which the electronic component are flip-chip mounted to the first substrate in any of the structures of the first to seventh aspects.

In accordance with the structure of the eighth aspect, back lowering of the entire surface acoustic wave device can be sought by flip-chip mounting the electronic component to the first substrate.

The invention in accordance with a ninth aspect of the invention provides a surface acoustic wave device in which the surface acoustic wave element is mounted to the second substrate with an adhesive and the electronic component is mounted to the first substrate with the same adhesive as that used in mounting the surface acoustic wave element in any of the structures of the first to eighth aspects.

In accordance with the structure of the ninth aspect, simplification of the manufacturing processes of the surface acoustic wave device can be sought by using the same adhesive.

The invention in accordance with a tenth aspect of the invention provides a manufacturing method of the surface acoustic wave device having a surface acoustic wave element and an electronic component that drive controls the surface acoustic wave element, in which the electronic component is mounted in the first hollow component of the first substrate with an opening, the second substrate with the surface acoustic wave element mounted is aligned in the opening of the first substrate as well as the electronic component and the surface acoustic wave element are electrically connected, the frequency adjustment of the surface acoustic wave element is performed, the cap with the second hollow component is arranged on the first substrate so as to accommodate the surface acoustic wave element in the second hollow component, and the first substrate and the second substrate, and the first substrate and the cap are joined with a sealant, respectively, to seal the electronic component and the surface acoustic wave element.

In accordance with the structure of the tenth aspect, the electronic component is mounted to the first hollow component of the first substrate from the opening, and the second substrate with the surface acoustic wave element mounted in this opening is aligned. Then, the frequency adjustment is performed by irradiating, e.g., a plasma, etc. on the surface acoustic wave element in a state wherein the surface acoustic wave element is drive controlled by the electronic component. Subsequently, the cap is arranged on the surface acoustic wave device, and the first substrate and the second substrate, and the first substrate and the cap are joined with a sealant, respectively.

Thus, when frequency adjustment is performed, the electronic component is in a state such that it is accommodated in the first hollow component and the first hollow component is closed by the second substrate. Therefore, the plasma, etc. are irradiated only on the surface acoustic wave element, but not on the electronic component in the frequency adjustment step. Moreover, inconvenience caused by irradiating the plasma to the electronic component in the frequency adjustment step can be reduced, minimized or prevented.

The invention in accordance with an eleventh aspect of the invention provides a manufacturing method of the surface acoustic wave device in which the second substrate is arranged in the opening of the first substrate in a state such that the sealant is applied on the lateral face side of the second substrate in the structure of the tenth aspect.

In accordance with the structure of the eleventh aspect, the first substrate and the second substrate are joined with a sealant applied on the lateral face side of the second substrate. This enables surely isolating the first hollow component and the second hollow component of the first substrate.

The invention in accordance with a twelfth aspect of the invention provides a manufacturing method of the surface acoustic wave device in which the grounding electrode made of a conducting material is formed on the joint face with the first substrate at the second substrate in the structure of either of the tenth or eleventh aspects.

In accordance with the structure of the twelfth aspect, a grounding electrode is formed on one face side of the second substrate, and is in a state such that it is placed between the electronic component and the surface acoustic wave element. Therefore, an electromagnetic wave, generated when the electronic component is actuated, is shielded by the grounding electrode, thereby reducing its influence on the surface acoustic wave element.

The invention in accordance with a thirteenth aspect of the invention provides a manufacturing method of the surface acoustic wave device in which the same sealant is used as the sealant that joins the first substrate and the second substrate and the sealant that joins the first substrate and the cap in any of the structures of the tenth to twelfth aspects.

In accordance with the thirteenth aspect of the invention, when the first substrate and the second substrate are joined and the first substrate and the cap are joined, hermetic sealing of the first hollow component and the second hollow component can be simultaneously performed under the same treatment conditions by using the same sealant.

The invention in accordance with a fourteenth aspect of the invention provides a manufacturing method of the surface acoustic wave device in which the brazing metal or the conductive adhesive is used as the sealant in any of the structures of the tenth to thirteenth aspects.

In accordance with the structure of the fourteenth aspect, if the brazing metal or the conductive adhesive is used as the sealant, the shielding effect on the electromagnetic wave can be obtained.

The invention in accordance with a fifteenth aspect of the invention provides a manufacturing method of the surface acoustic wave device in which the sealant is made of a glassy material in any of the structures of the tenth to thirteenth aspects.

In accordance with the structure of the fifteenth aspect, if the glassy material is used as the sealant, a cost reduction can be obtained.

The invention in accordance with a sixteenth aspect of the invention provides a manufacturing method of the surface acoustic wave device in which, when the electronic component is mounted to the first substrate, the mounting is performed by flip-chip bonding in any of the structures of the tenth to fifteenth aspects.

In accordance with the structure of the sixteenth aspect, back lowering of the entire surface acoustic wave device can be sought by flip-chip mounting the electronic component to the first substrate.

DETAILED DESCRIPTION OF PREFERRED EMBODIMENTS

Preferable embodiments of the present invention are described in detail hereafter, with reference to the attached drawings.

Figure 1:
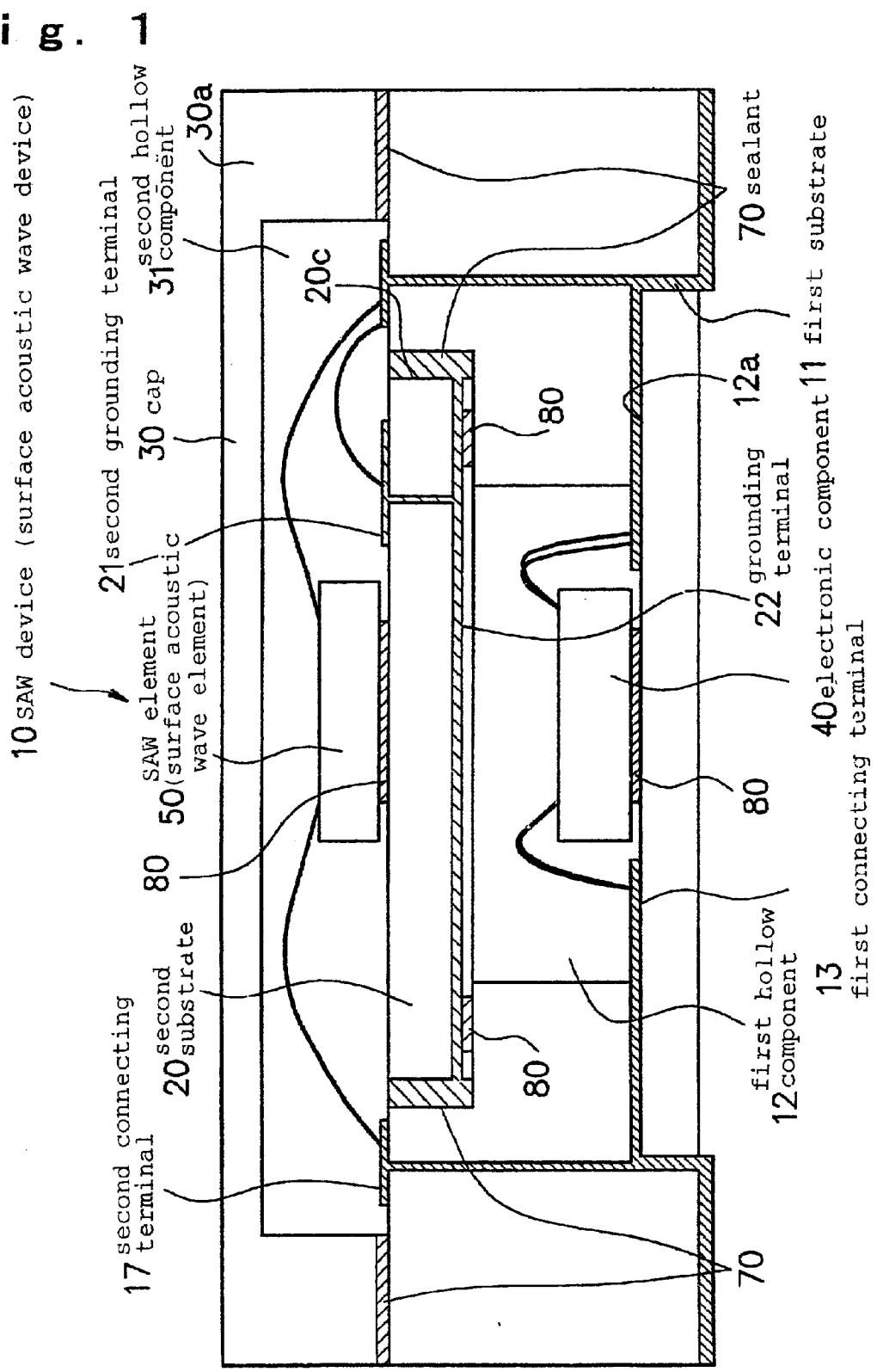
FIG. 1 is a schematic showing a preferable embodiment of a surface acoustic wave device of the present invention.
Figure 2:
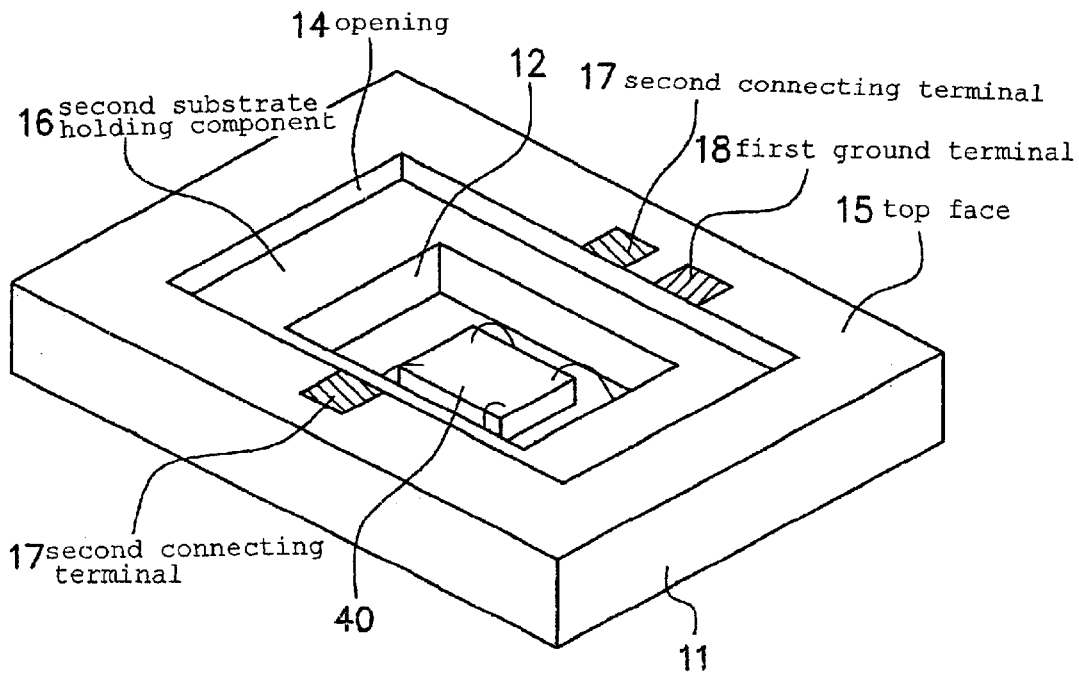
FIG. 2 is a perspective view showing the structure of a first substrate in the surface acoustic wave device of the present invention.

FIG. 1 and FIG. 2 are schematics showing preferable embodiments of a SAW device of the present invention. The SAW device 10 is described with reference to FIG. 1 and FIG. 2.

The SAW device 10 of FIG. 1 has a first substrate 11, a second substrate 20, a cap 30, an electronic component 40 and a SAW element 50, etc. The first substrate 11 is made of, e.g., ceramic, etc., and a first hollow component 12 is formed, e.g., at the central part of the first substrate 11. The electronic component 40 is mounted in the first hollow component 12, e.g. with an epoxy adhesive 80, etc.

A first connecting terminal 13 made of a conductive material is formed at the bottom 12a of the hollow component 12 and is electrically connected to the electronic component 40. Moreover, the first connecting terminal 13 is in a state in which it is electrically connected to the second connecting terminal 17, described below.

Thus, only the electronic component 40 is arranged, and the SAW element 50 is not arranged in the first hollow component 12. This enables prevention of the influence of heat generated when the electronic component 40 is actuated on the SAW element 50 via the atmosphere or the bottom 12a in the hollow component 12. Namely, the heat generated from the electronic component 40 is emitted to the side of the first substrate 11, thus reducing heat transferred to the second substrate 20. Therefore, a change of frequency caused by the heat in the SAW element 50 can be reduced, thereby enhancing reliability.

Moreover, a gas is generated from the adhesive 80 by the heat generation of the electronic component 40. This gas exerts an influence on the frequency characteristic of the SAW element 50. Here, the electronic component 40 and the SAW element 50 are arranged in separate spaces. Therefore, the SAW element 50 is not affected by the generated gas, and thus an enhancement of reliability of the SAW element 50 can be sought.

As shown in FIG. 2, an opening 14 is formed on the first substrate 11. The opening 14 is formed in nearly the same size as that of the second substrate 20 and in a greater area than that of the first hollow component 12. Therefore, a second substrate holding component 16 that holds the second substrate 20 is formed on the first substrate 11.

A second connecting terminal 17 and a first grounding terminal 18 are formed on the top face of the first substrate 11. The second connecting terminal 17 is electrically connected to the first connecting terminal 13 and connected to the SAW element 50, by, for example, wire bonding. The first grounding terminal 18 is electrically connected to a second grounding terminal 21 arranged on the second substrate 20 described below.

Figure 3:
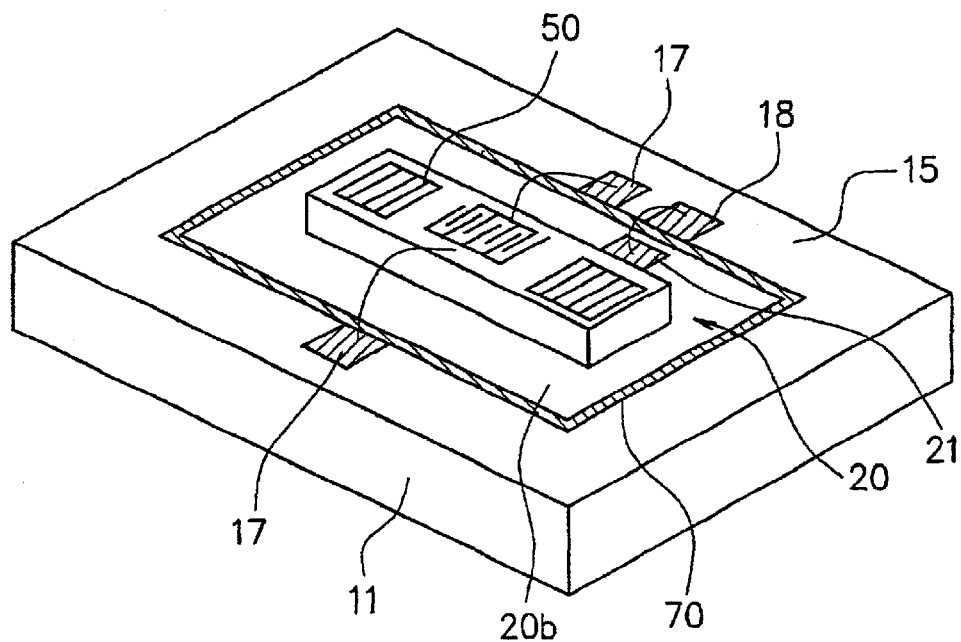
FIG. 3 is a perspective view showing the structure of a second substrate in the surface acoustic wave device of the present invention.

FIG. 3 is a perspective view showing an example of the second substrate 20 in the SAW device of present invention. The second substrate 20 is described with reference to FIG. 1 and FIG. 3.

The second substrate 20 of FIG. 1 includes, e.g., a ceramic single plate, and the like. One face side 20a of the second substrate 20 is joined to the first substrate 11 with the adhesive 80 applied on the second substrate holding component 16.

As with FIG. 3, the first substrate 11 is joined to the lateral face 20c of the second substrate 20 with a sealant 70, such as brazing metal, e.g., silver brazing, etc. or a conductive adhesive or a glassy material, etc. Particularly, a cost reduction can be sought when a glassy material is used as the sealant 70. Thus, the first hollow component 12 and the second hollow component 31 can be surely isolated by applying the sealant 70 in a manner to enclose the first substrate 11 and by joining the first substrate 11 and the second substrate 20.

Moreover, a grounding electrode 22 is formed over almost the entire surface on one face side 20a of the second substrate 20. The grounding electrode 22 is electrically connected to a second grounding electrode 21 formed on the other face side 20b. The grounding electrode 22 has the function of separating the SAW element 50 and the electronic component 40 electro-magnetically.

Namely, an electromagnetic wave, generated when the electronic component 40 is actuated, is shielded by the grounding electrode 22 and the influence of the electromagnetic wave on the SAW element 50 is suppressed to a minimum. This stabilizes the actuation of the SAW element 50.

As shown in FIG. 3, the SAW element 50 is mounted to the other face side 20b of the second substrate 20, e.g., with an epoxy adhesive 80. The SAW element 50 includes SAW filters and SAW resonators, etc. where interdigital transducers (IDT) or reflectors, etc. are formed on a quartz crystal substrate. The SAW element 50 is electrically connected to the second connecting terminal 17 of the first substrate 11, e.g., by wire bonding, etc. Therefore, the SAW element 50 is in a state that it is electrically connected to the electronic component 40 via the second connecting terminal 17 and the first connecting terminal 13.

Moreover, the second grounding terminal 21 is formed on the other face side 20b of the second substrate 20 and is electrically connected to the first grounding terminal 18, by, for example, wire bonding, etc.

In FIG. 1, a cap 30 is arranged on the SAW element 50, and the cap 30 is joined on the peripheral side 30a with a sealant 70.

The cap 30 has a second hollow component 31 and is in a state such that the SAW element 50 is sealed hermetically in the second hollow component 31. In this instance, the sealant 70 is made of the same material as that of the sealant 70 used to seal the first substrate 11 and the second substrate 20. This enables sealing to be accomplished under the same treatment conditions in the sealing step and to enhance manufacturing efficiency.

Only the electronic component 40 is mounted in the first substrate 11, and the SAW element 50 is mounted in the second substrate 20. Thus, the SAW element 50 is actuated in a state wherein a change of frequency due to a heat generated when the electronic component 40 is actuated is suppressed to the minimum. Therefore, the frequency change of the SAW element 50 due to the influence of heat can be reduced and reliability can be enhanced.

Moreover, a gas is generated from the adhesive used at the time of mounting the electronic component 40 due to heat from the electronic component 40. At this time, the electronic component 40 and the SAW element 50 are arranged in separate spaces. Therefore a change in the frequency characteristic of the SAW element 50 due to the influence of the generated gas can be suppressed and reliability of the SAW device 10 can be enhanced.

Furthermore, the SAW element 50 is actuated in a state in which a change of characteristics due to an electromagnetic wave, generated when the electronic component 40 is actuated, is suppressed to the minimum because it is arranged via the grounding electrode 22. Therefore a change of frequency of the SAW element due to the influence of the electromagnetic wave can be suppressed and reliability can be enhanced.

FIGS. 4(A) to 6(C) show a preferred embodiment of the manufacturing method of the SAW device of present invention. The manufacturing method of the SAW device is described with reference to FIGS. 4(A) to 6(C).

Figure 4:
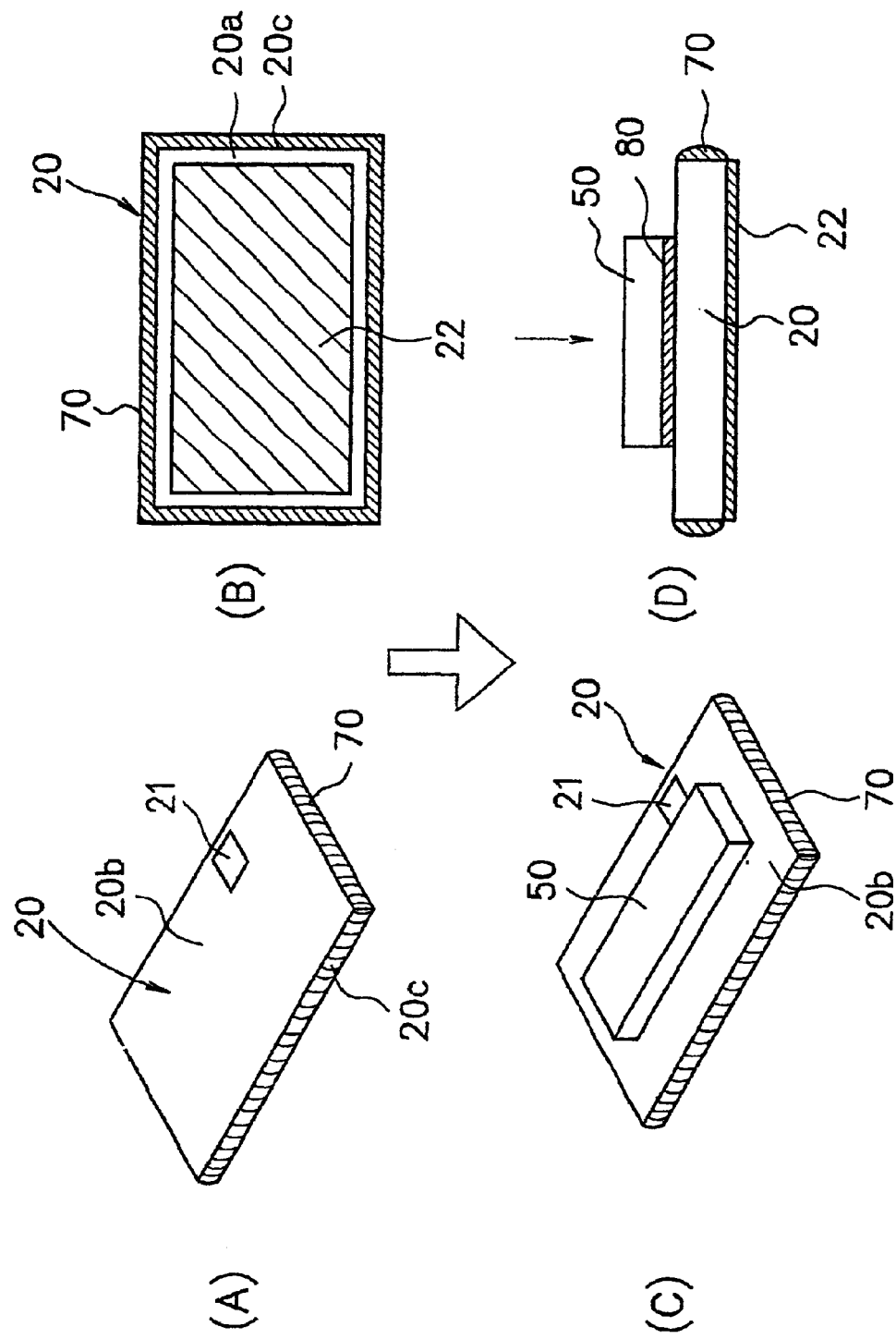
FIGS. 4(A)–4(D) show steps of the manufacturing process of the second substrate in the method of manufacturing the surface acoustic wave device of present invention.

First, a step for mounting the SAW element 50 to the second substrate 20 is described, with reference to FIG. 4. At first, a predetermined electrode pattern is formed on the second substrate 20 including, e.g., a ceramic single plate in FIG. 4(A) and FIG. 4(B). More specifically, a grounding electrode 22 is formed on the one face side 20a of the second substrate 20, and a second grounding terminal 21 is formed on the other face side 20b of the second substrate 20. At this time, the grounding electrode 22 and the second grounding terminal 21 are formed so as to be electrically connected. Moreover, a sealant 70 made, for example, of a brazing metal, such as silver brazing, a conductive adhesive or a glassy material, and the like is applied on the lateral face 20c of the second substrate 20.

Subsequently, as shown in FIG. 4(C) and FIG. 4(D), the SAW element 50 is mounted on the other face side 20b of the second substrate 20, e.g., with an epoxy adhesive, and the like, thereby completing the second substrate 20.

Figure 5:
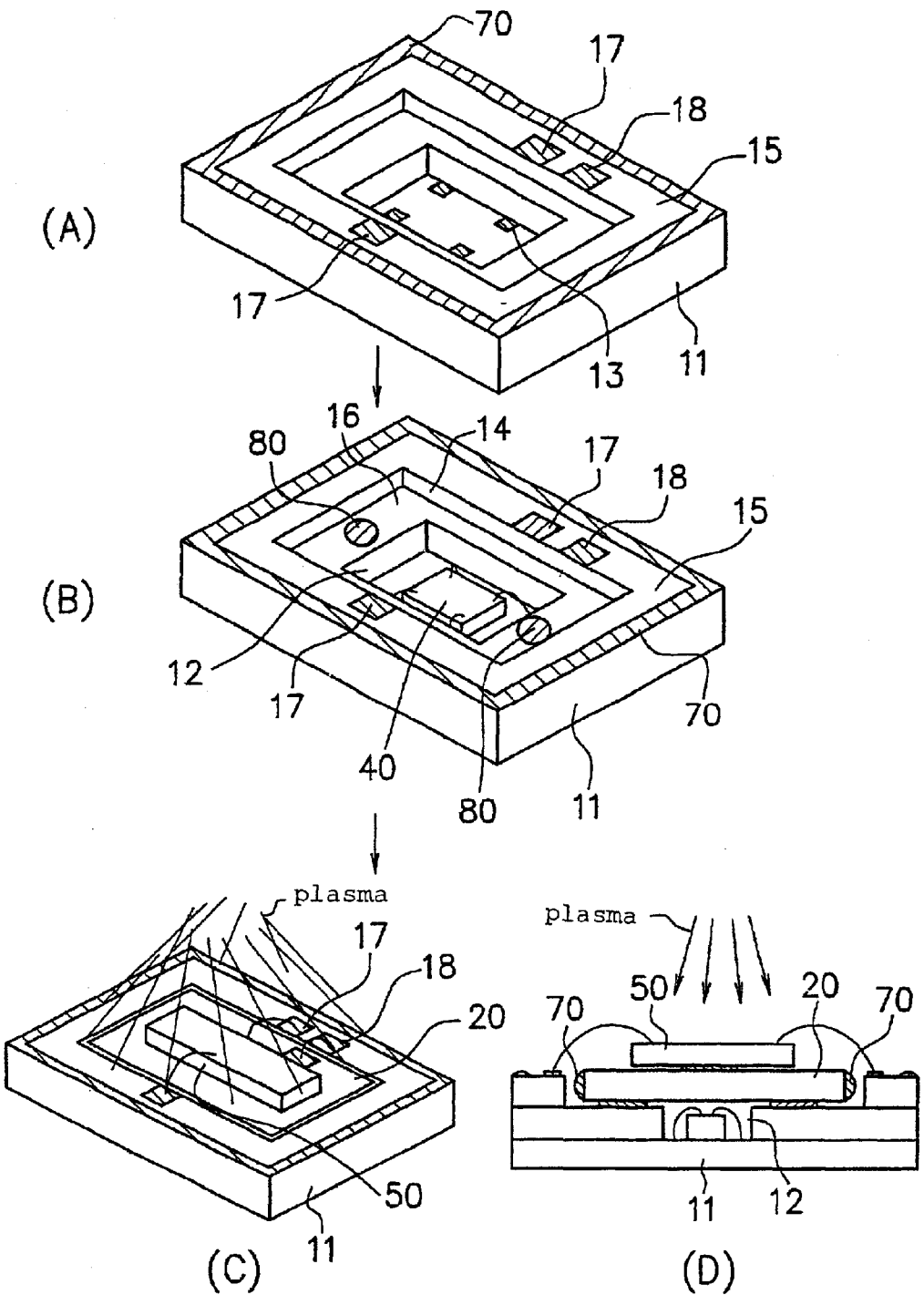
FIGS. 5(A)–5(D) show the state of the manufacturing process of the first substrate and frequency adjustment step in the manufacturing method of the surface acoustic wave device of the present invention.
Figure 6:
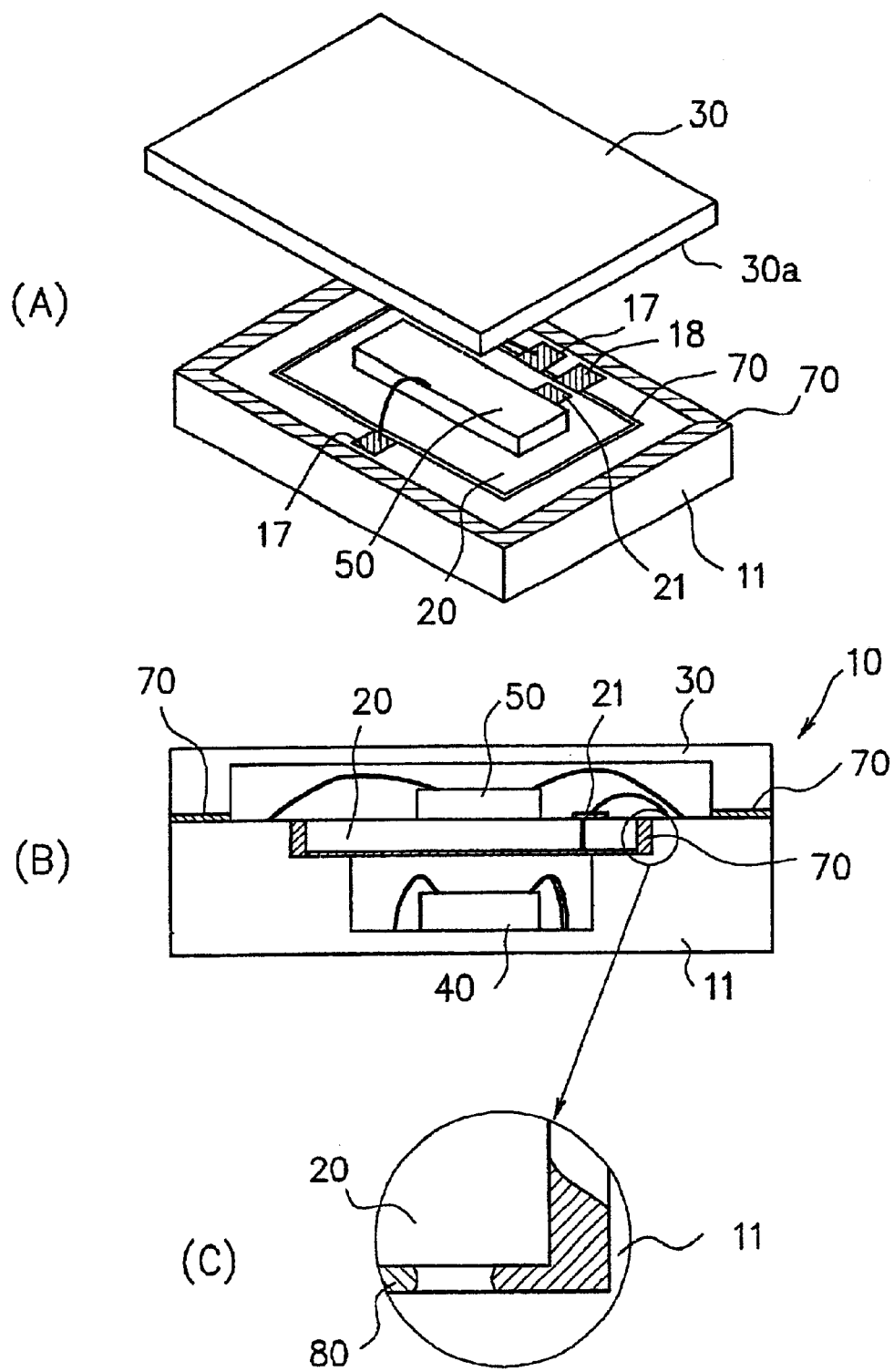
FIGS. 6(A)–6(C) show the state of a hermetic sealing of a surface acoustic wave element in the manufacturing method of the surface acoustic wave device of the present invention.

The manufacturing process of the first substrate 11 is described hereafter, with reference to FIG. 5.

First, as shown in FIG. 5(A), the first connecting terminal 13 is formed at the bottom 12a of the hollow component 12, and the second connecting terminal 17 and the first grounding terminal 18 are formed on the top face 15, respectively. The sealant 70 is applied on the peripheral side of the top face 15.

Afterward, as shown in FIG. 5(B), the electronic component 40 is inserted from an opening of the first substrate 11 into the hollow component 12 and is mounted to the bottom 12a with an epoxy adhesive 80, etc. Then, the electronic component 40 and the first connecting terminal 13 are electrically connected by, for example, wire bonding.

Moreover, the adhesive 80 that bonds the second substrate 20 is applied on the second substrate holding component 16.

Subsequently, as shown in FIG. 5(C) and FIG. 5(D), the second substrate 20 is aligned in the opening 14 of the first substrate 11, and the SAW element 50 and the second connecting terminal 17 are electrically connected, for example, by wire bonding, etc. In this state, plasma is irradiated to the SAW element 50 on the second substrate 20 to accomplish a frequency adjustment. More specifically, for example, a reactive gas such as $CF_4$, etc., or an inert gas such as argon gas, etc., is ionized, and then the ionized particles are irradiated on the SAW element 50. Then, piezoelectric substrates or electrodes of the SAW element 50 are plasma etched to accomplish the frequency adjustment.

In the step for conducting the frequency adjustment, the electronic component 40 is not irradiated with the plasma because it is mounted in the hollow component 12. Therefore, inconvenience caused by poor actuations due to the plasma can be reduced, minimized or avoided because the electronic component 40 is accommodated in the first hollow component 12.

Moreover, the frequency adjustment step is performed by adjusting the amount of etching while driving the SAW element 50. At this time, the electronic component 40 and the SAW element 50 are in a state that they are electrically connected by the first connecting terminal 13 and the second connecting terminal 17 arranged on the first substrate 11. Therefore, frequency adjustment can be conducted while drive controlling is performed on the SAW element 50.

Next, as shown in FIG. 6(A) and FIG. 6(B), the cap 30 is aligned on the sealant 70 applied on the top face 15 of the first substrate 11 and then thermally treated. The sealant 70 between the first substrate 11 and the second substrate 20 and the sealant 70 between the first substrate 11 and the cap 30 melt, and the first hollow component 12 and the second hollow component 31 become hermetically sealed.

Thus, hermetic sealing can be accomplished under the same treatment conditions, and enhancement of manufacturing efficiency can be obtained by using the sealant 70 used for the first substrate 11 and the second substrate 20, and the sealant 70 used for the first substrate 11 and the cap 30, that are made of the same material.

Particularly, if the sealant 70 arranged on the lateral face 20c of the second substrate 20 melts, as shown in FIG. 6(C), the sealant 70 enters into a gap occurring between the first substrate 11 and the second substrate 20. Thus the first hollow component 12 and the second hollow component 31 can be surely sealed hermetically.

Figure 7:
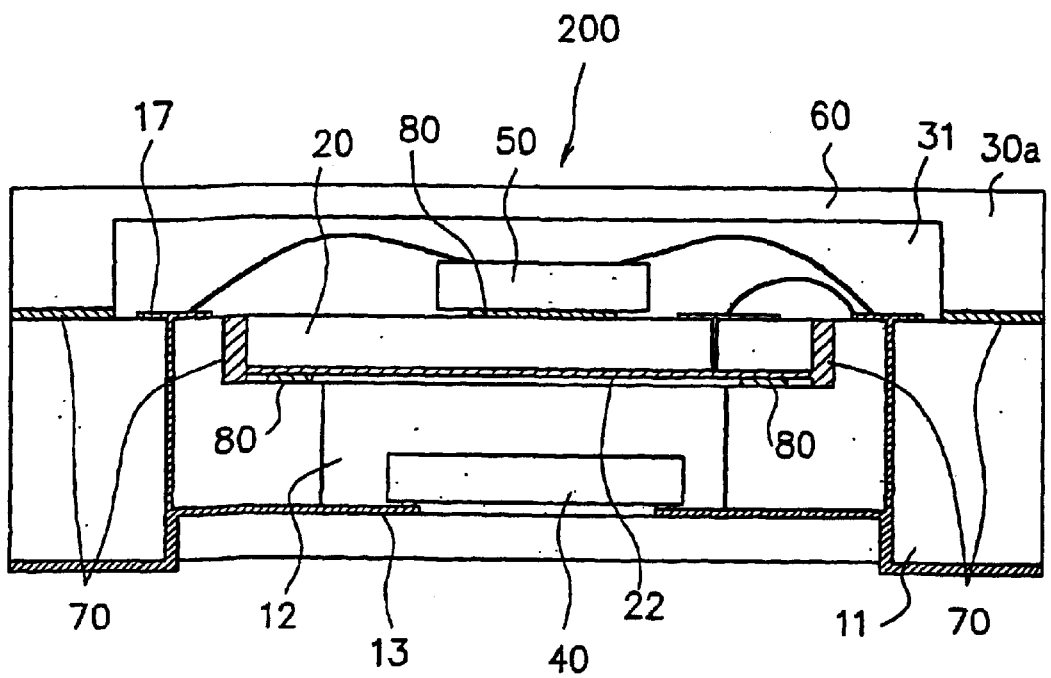
FIG. 7 is a schematic showing a second embodiment of the surface acoustic wave device of the present invention.
Figure 8:
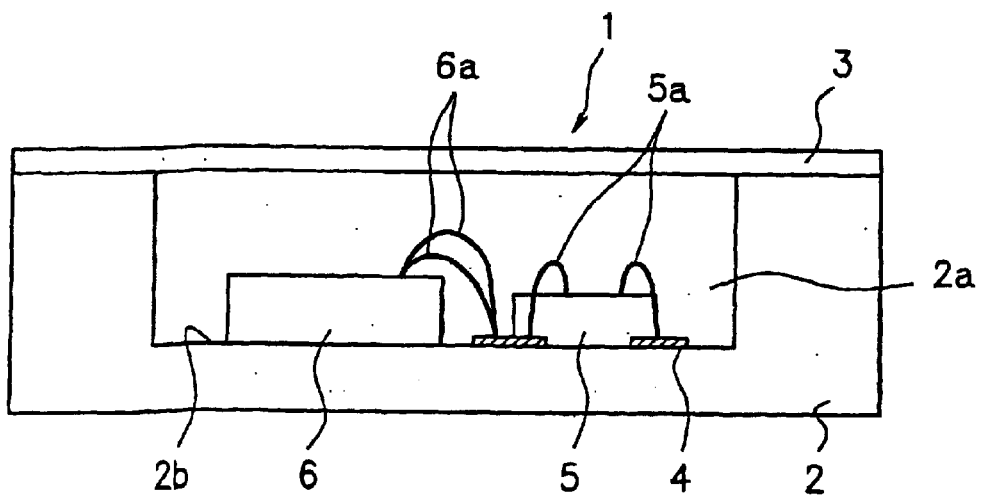
FIG. 8 is a schematic showing an example of a conventional surface acoustic wave device.
Figure 9:
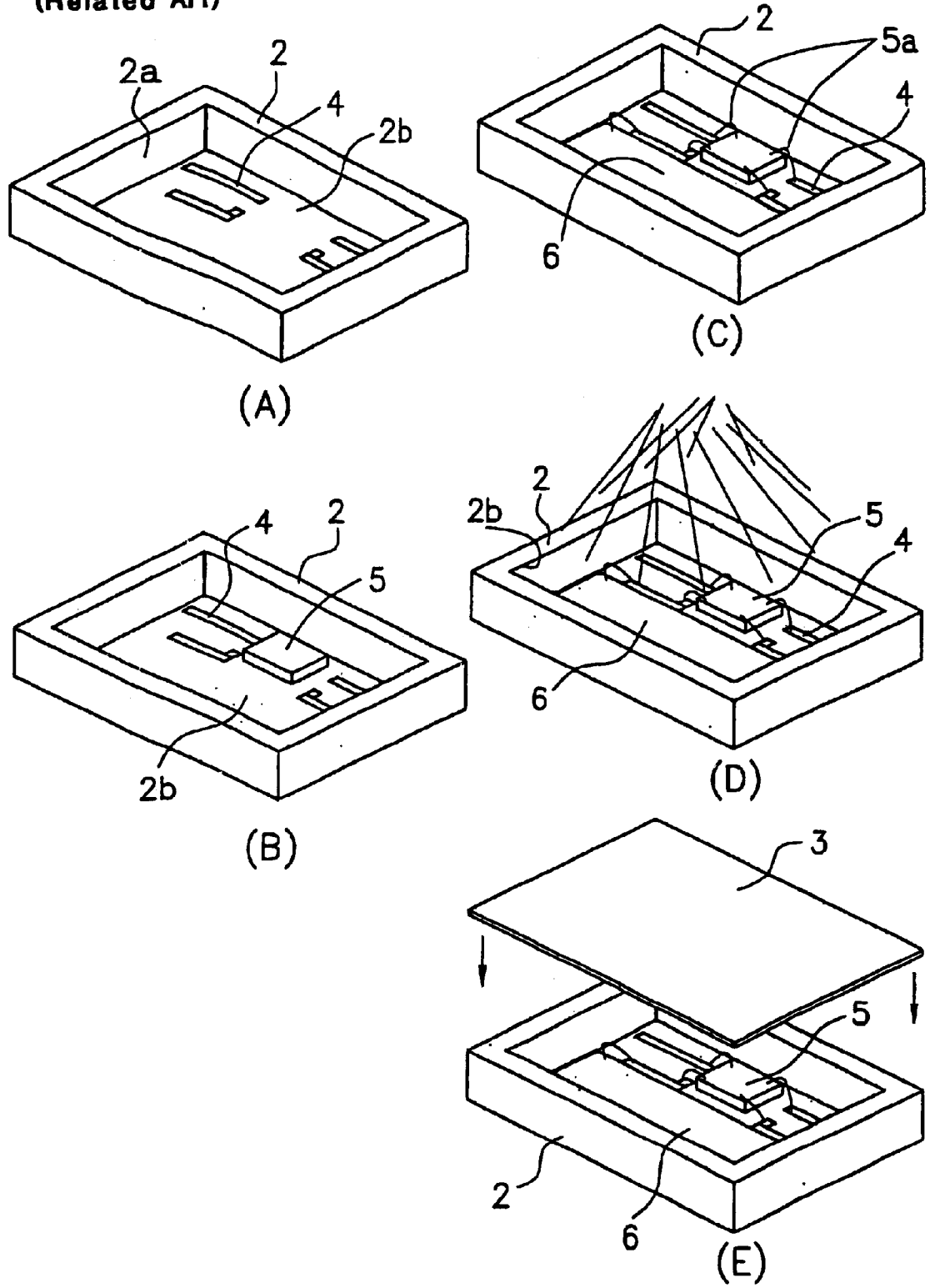
FIGS. 9(A)–9(E) are perspective views showing steps of a manufacturing method of a related art surface acoustic wave device.

In FIG. 1, the electronic component 40 is electrically connected by wire bonding to the first connecting terminal 13 of the first substrate 11. However, as shown in FIG. 7, a flip-chip bonded SAW device 200 to be decreased may also be used. Namely, in FIG. 7, a bump is formed on the electronic component 40, and the bump is mounted by joining to the first terminal 13 of the first substrate 11. This enables the thickness (height) of the SAW device 200 to be decreased.

With the above embodiment, the influence of the heat and gas, etc., generated when the electronic component 40 is actuated, on the SAW element 50 can be suppressed to a minimum by arranging only the electronic component 40 in the first hollow component 12 of the first substrate 11, and mounting the SAW element 50 on the other side 20b of the second substrate 20. Accordingly, the SAW device 10 can enhance its reliability.

Moreover, the first hollow component 12 of the first substrate 11 can be surely sealed hermetically by joining the first substrate 11 and the second substrate 20 with the sealant 70 applied on the lateral face side 20c of the second substrate 20.

Furthermore, the hermetic sealing of the first hollow component 12 and the second hollow component 31 can be accomplished under the same treatment conditions, by using the same sealant 70, when the first substrate 11 and the second substrate 20 are joined and when the first substrate 11 and the cap 30 are joined. Therefore, efficiency in manufacturing the SAW device 10 is further enhanced.

Furthermore, the grounding electrode 22 shields the electromagnetic wave, generated when the electronic component 40 is actuated, by being formed on the one face side 20a of the second substrate 20, and the influence on the SAW element 50 is reduced.

Additionally, back lowering of the entire SAW device 10 can be obtained by flip-chip mounting the electronic component 40 on the first substrate 11.

Moreover, when the frequency adjustment is performed in the manufacturing method of the SAW device, the electronic component 40 is accommodated in the first hollow component 12, and the first hollow component 12 is closed by the second substrate 20. Therefore, the plasma, etc., is only irradiated on the SAW element 50, but not on the electronic component 40 in the frequency adjustment step. This enables inconveniences caused by irradiating the plasma to the electronic component 40 in the frequency adjustment step to be prevented.

As described above, the present invention provides a surface acoustic wave device, which enhances reliability and yield, and the manufacturing process thereof.

What is claimed is:

1. A surface acoustic wave device, comprising:
   a surface acoustic wave element;
   an electronic component that drive controls the surface acoustic wave element;
   a first substrate that defines an opening and which has a first connecting terminal electrically connected to the electronic component, the electronic component being disposed in the opening of the first substrate;
   a second connecting terminal formed in the vicinity of the opening, and electrically connected to the first connecting terminal;
   a second substrate which is mounted so that one face side is joined to the opening of the first substrate and an other face side allows the surface acoustic wave element to be electrically connected to the second connecting terminal; and
   a cap which is joined to the first substrate and has a second hollow component that hermetically seals the surface acoustic wave element.

2. The surface acoustic wave device according to claim 1, the first substrate and the second substrate being joined on a lateral face side of the second substrate with a sealant.

3. The surface acoustic wave device according to claim 1, the second substrate and the cap being joined to the first substrate, respectively with a same sealant.

4. The surface acoustic wave device according to claim 2, the sealant being made of at least one of a conductive brazing metal and a conductive adhesive.

5. The surface acoustic wave device according to claim 2, the sealant being made of a glassy material.

6. The surface acoustic wave device according to claim 1, further including a grounding electrode fanned on the one face side of the second substrate.

7. The surface acoustic wave device according to claim 1, the second substrate including a ceramic single plate.

8. The surface acoustic wave device according to claim 1, the electronic component being a flip-chip mounted to the first substrate.

9. The surface acoustic wave device according to claim 1, the surface acoustic wave element being mounted on the second substrate with an adhesive, and the electronic component being mounted on the first substrate with a same adhesive as that used to mount the surface acoustic wave element.

10. The surface wave acoustic device according to claim 1, further including a hollow holding component disposed within the opening of the first substrate, the hollow holding component defining an axial hole, the electronic component being disposed within the axial hole.

* * * * *